(12) United States Patent
Wu

(10) Patent No.: US 10,672,751 B2
(45) Date of Patent: Jun. 2, 2020

(54) CONTOURED PACKAGE-ON-PACKAGE JOINT

(71) Applicant: Taiwan Semiconductor Manufacturing Company, Ltd., Hsinchu (TW)

(72) Inventor: Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 64 days.

(21) Appl. No.: 15/980,131

(22) Filed: May 15, 2018

(65) Prior Publication Data

US 2018/0261587 A1    Sep. 13, 2018

Related U.S. Application Data

(60) Continuation of application No. 15/069,097, filed on Mar. 14, 2016, now Pat. No. 9,991,246, which is a
(Continued)

(51) Int. Cl.
*H01L 25/00* (2006.01)
*H01L 23/31* (2006.01)
(Continued)

(52) U.S. Cl.
CPC .......... *H01L 25/50* (2013.01); *H01L 21/4853* (2013.01); *H01L 23/31* (2013.01); *H01L 23/49811* (2013.01); *H01L 24/81* (2013.01); *H01L 25/0657* (2013.01); *H01L 25/105* (2013.01); *H01L 24/16* (2013.01);
(Continued)

(58) Field of Classification Search
CPC ... H01L 25/50; H01L 25/0657; H01L 25/105;
H01L 23/31; H01L 23/49811; H01L 2224/131; H01L 2224/16238; H01L 2224/32145; H01L 2224/48091; H01L 2224/48227; H01L 2224/73265; H01L 2224/81009; H01L 2224/8101; H01L 2224/81191; H01L 2224/91193; H01L 2224/45099; H01L 2225/0652; H01L 2225/06517; H01L 2225/06548; H01L 2225/1023; H01L 2225/1058;
(Continued)

(56) References Cited

U.S. PATENT DOCUMENTS 6,352,881 B1    3/2002  Nguyen et al.
2003/0080408 A1    5/2003  Farnworth et al.
(Continued)

FOREIGN PATENT DOCUMENTS

EP    1435533 A1    7/2014

*Primary Examiner* — Timor Karimy
(74) *Attorney, Agent, or Firm* — Slater Matsil, LLP

(57) ABSTRACT

A contoured package on package joint and a method for making the same are disclosed herein. A method for forming a device comprises providing a substrate having a package land and forming a mounting stud on the package land. A molded underfill is applied to the substrate and in contact with the mounting stud. A contoured stud surface is formed on the mounting stud is contoured and connecting member attached to the contoured stud surface with a second package attached to the connecting member. The connecting member may be solder and have a spherical shape. The contoured stud surface may be etched or mechanically formed to have a hemispherical shape conforming to the connecting member shape.

20 Claims, 10 Drawing Sheets

Related U.S. Application Data division of application No. 13/671,366, filed on Nov. 7, 2012, now Pat. No. 9,287,245.

(51) Int. Cl.
*H01L 23/498* (2006.01)
*H01L 25/10* (2006.01)
*H01L 21/48* (2006.01)
*H01L 23/00* (2006.01)
*H01L 25/065* (2006.01)

(52) U.S. Cl.
CPC ........ *H01L 24/48* (2013.01); *H01L 2224/131* (2013.01); *H01L 2224/16238* (2013.01); *H01L 2224/32145* (2013.01); *H01L 2224/45099* (2013.01); *H01L 2224/48091* (2013.01); *H01L 2224/48227* (2013.01); *H01L 2224/73265* (2013.01); *H01L 2224/8101* (2013.01); *H01L 2224/81009* (2013.01); *H01L 2224/81191* (2013.01); *H01L 2224/81193* (2013.01); *H01L 2225/0652* (2013.01); *H01L 2225/06517* (2013.01); *H01L 2225/06548* (2013.01); *H01L 2225/1023* (2013.01); *H01L 2225/1058* (2013.01); *H01L 2225/1088* (2013.01); *H01L 2924/00014* (2013.01); *H01L 2924/18161* (2013.01)

(58) Field of Classification Search
CPC ... H01L 2225/1088; H01L 2924/00014; H01L 2924/18161
See application file for complete search history.

(56) References Cited

U.S. PATENT DOCUMENTS

| | | |
|---|---|---|
| 2005/0184377 A1 | 8/2005 | Takeuchi et al. |
| 2006/0281363 A1 | 12/2006 | Trezza |
| 2008/0184377 A1 | 7/2008 | Kato |
| 2008/0213941 A1 | 9/2008 | Pendse |
| 2008/0213947 A1 | 9/2008 | Shimonaka et al. |

CONTOURED PACKAGE-ON-PACKAGE JOINT

This application is a continuation of U.S. patent application Ser. No. 15/069,097, filed Mar. 14, 2016, entitled "Contoured Package-on-Package Joint," which is a division of U.S. patent application Ser. No. 13/671,366, filed Nov. 7, 2012, entitled "Contoured Package-on-Package Joint," now U.S. Pat. No. 9,287,245, issued on Mar. 15, 2016, which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also, in some instances, require smaller packages that utilize less area than packages of the past.

Package on package (PoP) technology is becoming increasingly popular for its ability to allow denser integration of integrated circuits into a small overall package. PoP technology is employed in many advanced handheld devices, such as smart phones. While PoP technology has allowed for a lower package profile, the total thickness reduction is currently limited by the solder ball joint height and the distance between adjacent joints, referred to as the pitch. Dies are sometimes mounted to an interposer substrate or other packaging carrier via a mounting conductor such as a ball grid array, land grid array, pin array, or the like. In some instances, an undermount filler or underfill may be applied between the die and the interposer PC board to fill the spaces between the mounting conductors.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable concepts that can be embodied in a wide variety of specific contexts. The specific embodiments discussed are merely illustrative of specific ways to make and use the disclosure, and do not limit the scope of the disclosure. Note that, for simplification, not all element numbers are included in each subsequent drawing. Rather, the element numbers most pertinent to the description of each drawing are included in each of the drawings.

Figure 1:
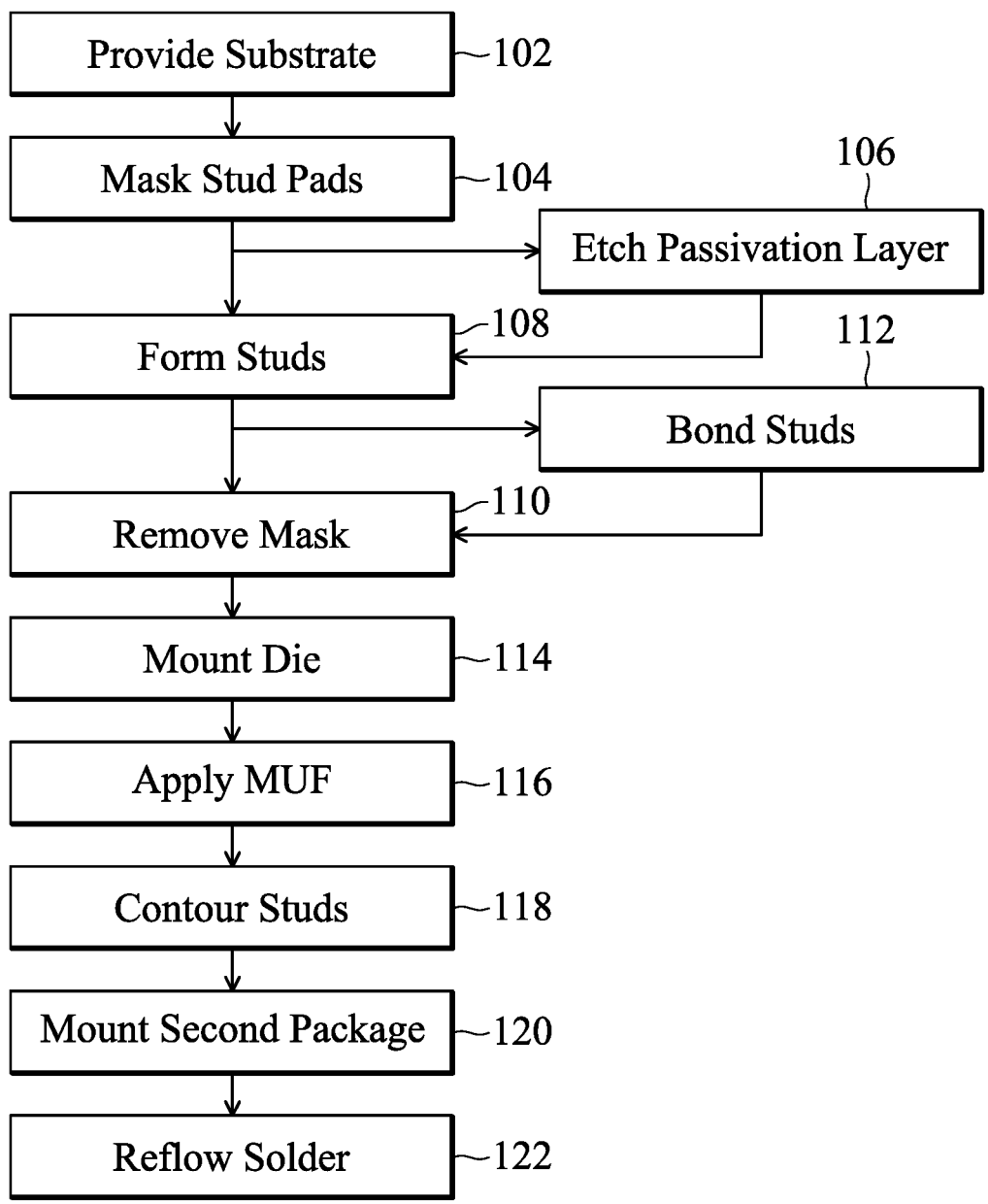
FIG. 1 is a flow diagram illustrating a method for forming a package-on-package device with contoured mounting studs according to an embodiment of the disclosure.

FIG. 1 is a flow diagram illustrating a method 100 for forming a package-on-package device with contoured mounting studs according to an embodiment of the disclosure, and is described in conjunction with FIGS. 2 through 9, which illustrate cross-sectional views of intermediate steps the embodiment of the method 100 of FIG. 1.

Figure 2:
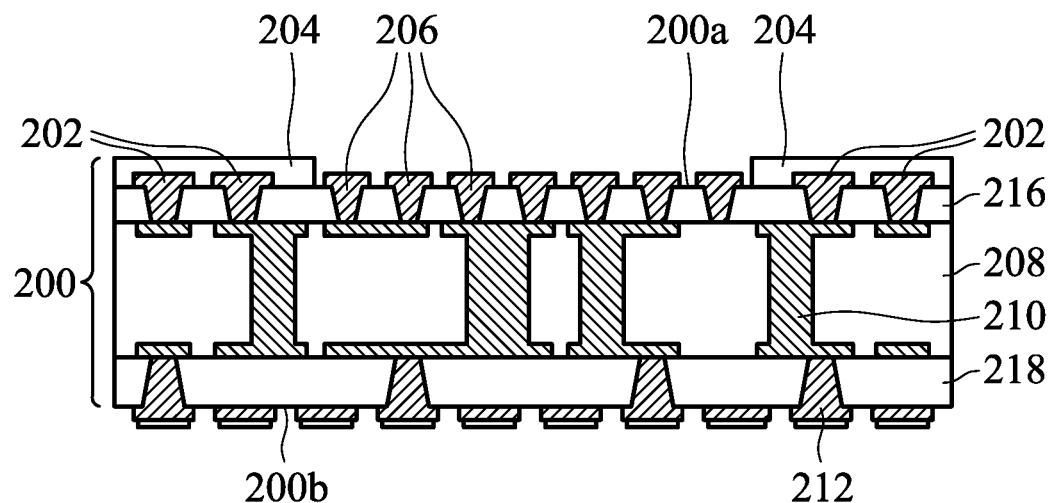
FIGS. 2 through 9 illustrate cross-sectional views of intermediate steps in forming a package-on-package device with contoured mounting studs according to an embodiment of the disclosure.

Referring now to FIG. 1, a first substrate 200 is provided in block 102, as shown in FIG. 2. The first substrate 200 may comprise an interposer substrate 208 having one or more through vias 210, one or more die lands 206, one or more package lands 202, and one or more mounting lands 212. While a single first substrate 200 is shown in the drawings, several first substrates 200 may optionally be processed on a workpiece (not shown) comprising a plurality of first substrates 200, and the workpiece may be singulated during a subsequent process step.

The interposer substrate 208 may have one or more redistribution layers (RDLs) 216, 218 disposed on one or both sides of the interposer substrate 208. The interposer substrate 208 through vias 210 may comprise conductive material connecting the first RDL 216 at the first side 200a of the first substrate 200 to the second RDL 218 at the second side 200b of the substrate. The RDLs 216 and 218 may comprise dielectric layers with one or more mounting pads or lands 202, 206 and 212 which may be electrically connected to the through vias 210 and each with at least one surface exposed through the surface of the RDLs 216 and 218. For example, the first RDL 216 may have one or more package lands 202 configured for mounting a second package 902 (not shown in FIG. 2, see FIG. 9) or one or more die lands 206 configured for mounting one or more dies 602 (not shown in FIG. 2, see FIG. 6) on the first RDL 216. The second RDL 218 may have one or more mounting lands 212 for mounting the completed package-on-package device 900 (not shown in FIG. 2, see FIG. 9) to a PCB, to another package or device, or the like.

In some embodiments, the first substrate 200 may optionally comprise a passivation layer 204 or other protective layer disposed on the first RDL 216. The passivation layer 204 may be an oxide, a nitride, an anticorrosion coating, or another suitable coating. The passivation layer may lie over the package lands 202, or may be formed with openings, for example, with opening over the die lands 206.

Figure 3:
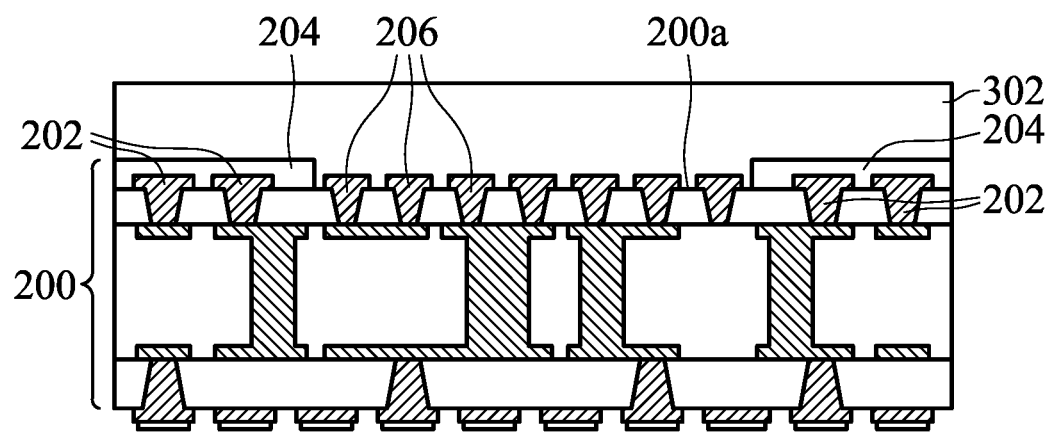

The stud pads or mounting lands 202 maybe masked in block 104, as illustrated in FIG. 3. A mask 302 may be formed from material such as a spin-on photoresist, a hard mask, or the like to form a mask 302. The mask 302 may be patterned, for example, by exposure and development of a photoresist mask 302. In another embodiment, a hard mask 302 may be used. In such an embodiment, a hard mask 302 material, such as nitride layer, for example, may be deposited, patterned and etched to result in a patterned hard mask 302.

Figure 4:
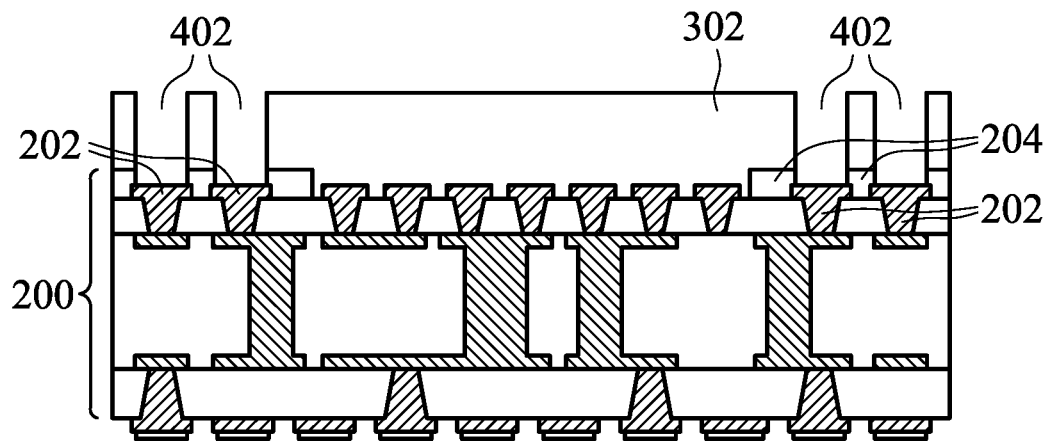

The passivation layer 204 may be etched in block 106, as illustrated in FIG. 4. Patterning the mask 302 may result in one or more stud openings 402 formed in the mask. The passivation layer etching of block 106 may be omitted, for example, where a passivation layer 204 is absent, or where the passivation layer 204 is formed with openings over the package lands 202.

Figure 5:
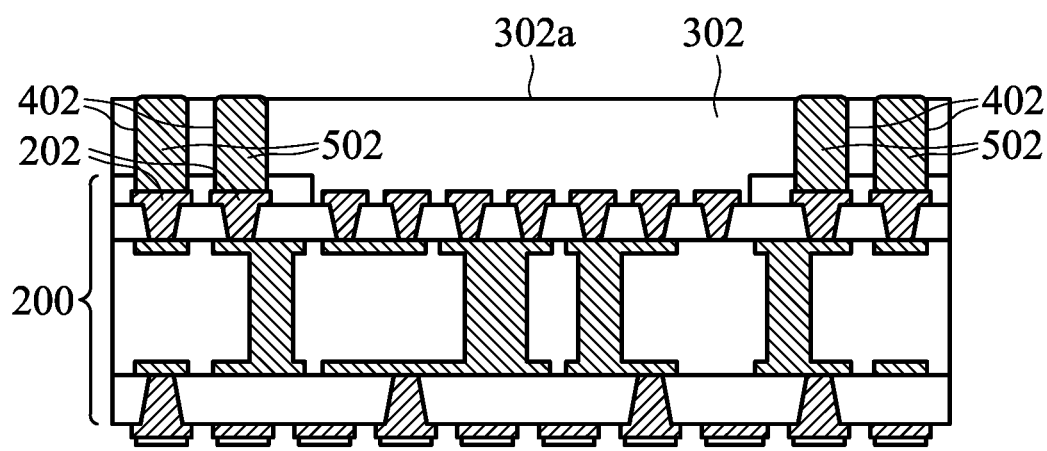

Mounting studs 502 may be formed on the package lands 202 in block 108, and as shown in FIG. 5. The mounting studs 502 may be disposed on, and in electrical contact with the package lands 202. In one embodiment, the mounting studs 502 may be formed through a deposition process such as electroplating, plasma enhanced vapor deposition, chemical vapor deposition, physical vapor deposition, sputtering, or another process. In another embodiment, the mounting studs 502 may be formed separately from the first substrate 200 and then placed on the package lands 202.

The mounting studs 502 may be formed of any suitable conductive material, for example, copper, gold, tungsten, aluminum, alloys of any of the same, conductive polymers, or the like. In some embodiments, the mounting studs 502 will have a melting point greater than that of solder, and may also have a structural rigidity sufficient to support mounting of a second package 902 (see FIG. 9).

The mounting studs 502 may also be formed to a predetermined height, and in one embodiment, may be formed to have a top surface about level with the top surface 302a of the mask 302. In another embodiment, the mounting studs 502 may be formed to have a top surface below the top surface 302a of the mask 302.

Figure 6:
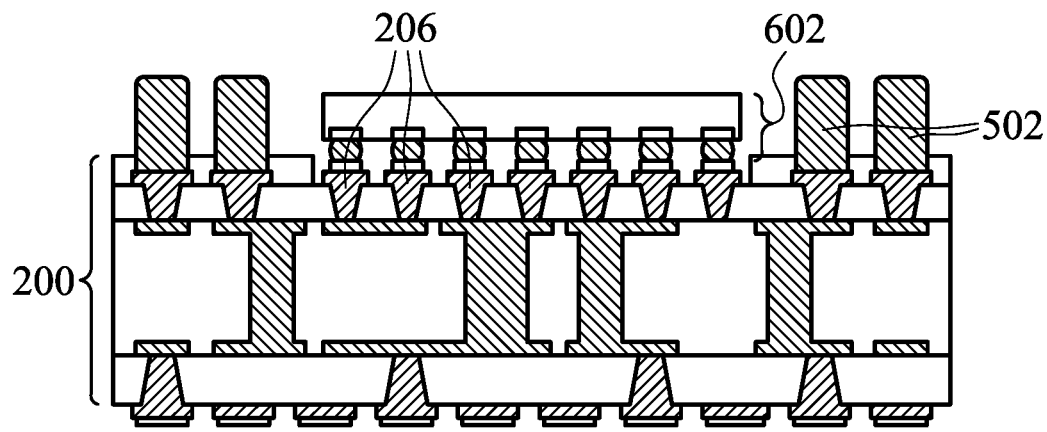

The mask may be removed in block 110 and a die 602 mounted on the first substrate 200 in block 114. FIG. 6 illustrates the first substrate 200 after removing the mask 302 (see FIG. 5) and after mounting the die 602. One or more dies 602 may be mounted on the die lands 206. While the mounting of a single die 602 is illustrated for clarity, any number of dies 602 may be mounted to the die lands 206. The die 602 may, in some embodiments, be mounted to the die lands 206 via solder balls in a ball grid array, via surface mount technology, pin grid arrays, wire interconnects, conductive adhesive, a socket, or another suitable technique.

Figure 7:
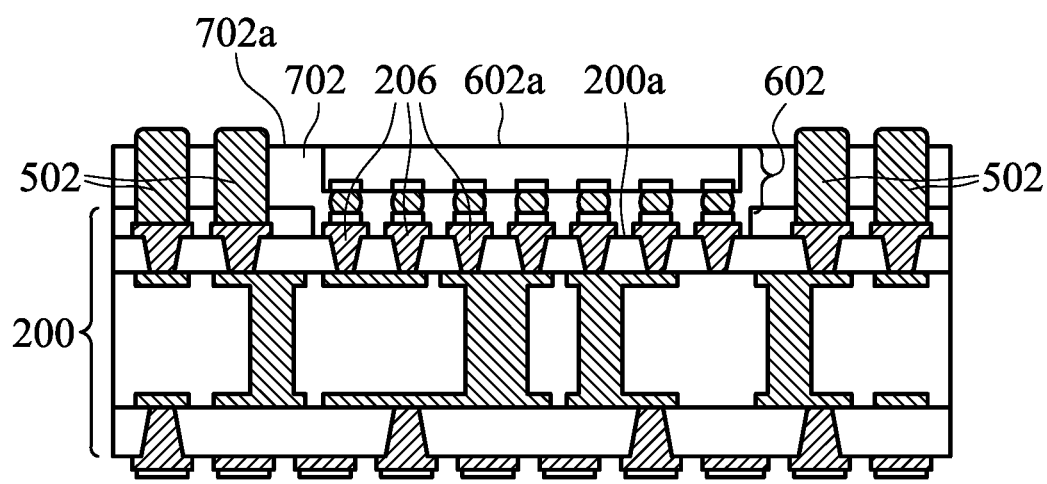

A molded underfill (MUF) 702 maybe applied in block 116, as shown in FIG. 7. The MUF 702 may fill the area under the die 602 and the area around the package lands 202. In some embodiments, the MUF 702 may be a nonconductive material, and may be an epoxy, a resin, a moldable polymer, or the like. The MUF 702 may be applied while substantially liquid, and then may be cured through a chemical reaction, such as in an epoxy or resin. In other embodiments, the MUF 702 may be an ultraviolet (UV) or thermally cured polymer applied as a liquid, gel or malleable solid.

In one embodiment, a mold may be provided to retain and shape the MUF 702 during application and curing. For example, a mold may have a border or other feature for retaining the MUF 702 material when applied. The mold may optionally further comprise a release film to assist in parting the mold from the MUF 702. The optional release film may be used in embodiments where the MUF 702 is an epoxy or resin to prevent the MUF 702 material from adhering to the mold surface.

In one embodiment, the MUF 702 may be applied to have a top surface 702a below, or lower than the top surface 602a of the die 602. Additionally, the MUF 702 may have a top surface 702a exposing a top portion of the mounting studs 502. In another embodiment, the MUF 702 may be formed over the top surface 602a of the die 602, or over the top surfaces of the mounting studs 502, and may be reduced via polishing or grinding to expose a portion of the mounting studs 502.

Figure 8:
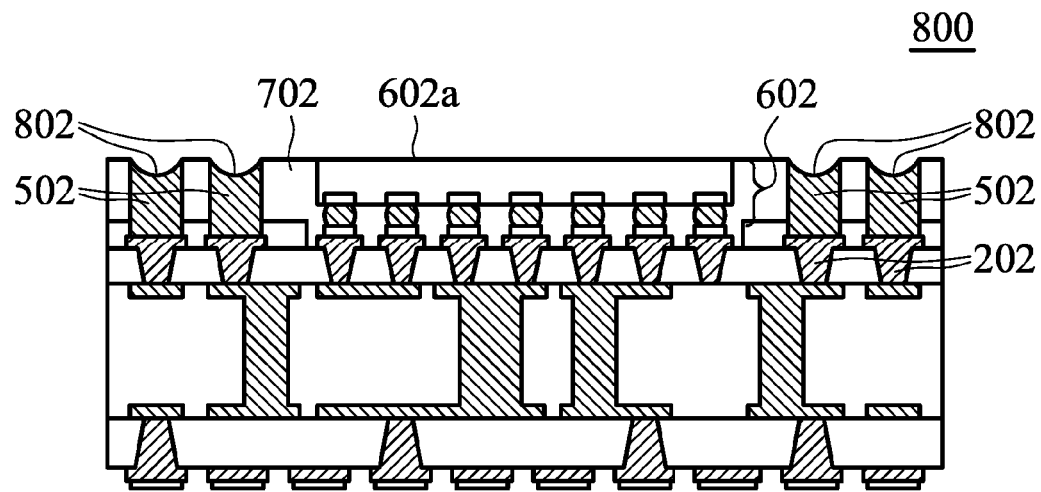

The mounting studs 502 may be contoured in block 118, as shown in FIG. 8. A first package 800 having contoured mounting studs 502 is thus formed. In one embodiment, a contoured stud surface 802 may be formed at the top of the mounting stud 502, and may accept a connecting member 904 (not shown, see FIG. 9) to attach a second package 902 (FIG. 9).

The mounting studs 502 may be contoured using chemical means, mechanical means, or via another suitable procedure. For example, in one embodiment, the mounting studs 502 may be copper, and may be etched with ferric chloride ($FeCl_3$) or a copper chloride ($CuCl_2$) and hydrochloric acid (HCl) solution. A spray or vapor etching environment may permit etching of a generally hemispherical contoured stud surface 802. The concentrations of etchant and etching conditions may be predetermined to result in a contoured stud surface 802 having a radius and depth calculated to accept a complementary connecting member 904 of a predetermined size. For example, a directed spray etch may direct a greater amount of etchant to the center of the mounting stud 502 to etch the center of the mounting stud 502 to a greater depth. Additionally, one or more contact masks or non-contact stencils may be used to mask all or part of the mounting stud surface during, for example, a spray etch. In such an embodiment, an etchant spray may be directed through a non-contact stencil with an opening smaller than the cross section of the mounting stud 502, and the spray may diffuse across the surface of the mounting stud, but be primarily directed to the center of the mounting stud to etch to etch the center of the mounting stud 502 to a greater depth. One embodiment may be where a series of contact masks are applied to the mounting stud to permit etching to a greater depth at the center of the mounting stud 502.

In another embodiment, the contoured stud surface 802 may be mechanically created by a process such as milling, drilling, abrasive removal or cutting. For example, a ball end mill having a predetermined radius may be used to mill the mounting stud 502 to create the desired topography for the contoured stud surface 802. Alternatively, the contoured stud surface 802 may be created by abrasive blasting or abrasive grinding.

Figure 9:
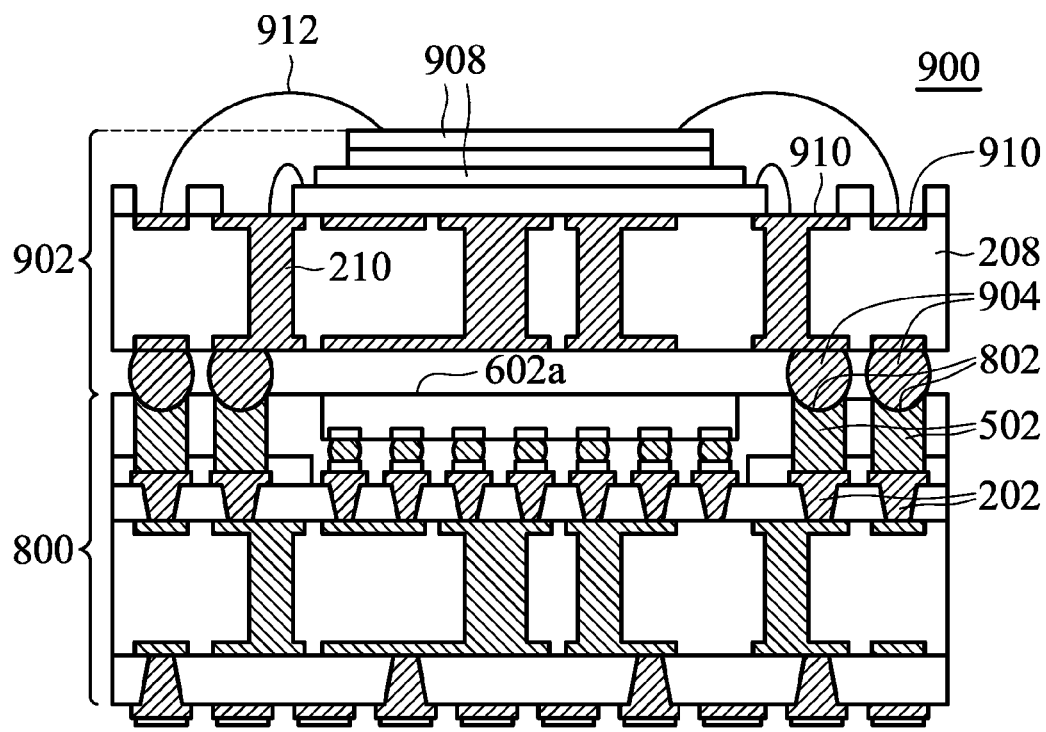

A second package 902 may be mounted to the first package 800 in block 120, resulting in a package-on-package device 900 shown in FIG. 9. A connecting member 904 may be used to connect the second package 902 to the first package 800.

In some embodiments, the second package 902 may have an interposer substrate 208 with one or more vias 210 disposed therein. The interposer substrate 208 may the same material as the first substrate 200 interposer substrate 208, or may be a different material. In some embodiments, one or more second dies 908 may be mounted to the second package 902 by way of an adhesive or other mounting technique. The second dies 908 may be electrically connected to one or more via lands 910 in the interposer substrate 208 via a wire bond 912. In other embodiments, the second dies 908 may be mounted to the second package 902 interposer substrate 208 via a ball grid array, via a socket, via surface mounting technology, or the like. The second dies 908 may be in electrical communication with the first package 800 by way of the connecting member 904, the mounting studs 502, and the package lands 202.

In some embodiments, the connecting members 904 may be solder balls applied to via lands 910 connected to vias 210 in the interposer substrate and exposed at both sides of the second package 902. Additionally, solder, where used for the connecting members 904, may be reflowed in block 122 to affix the second package 902 to the first package 800. In yet other embodiments, the connecting members may be solid material such as copper, gold, or the like, and affixed to the mounting studs 502 via a thin coating of solder, solder paste or a conductive adhesive. In some embodiments, the connecting member 904 may be, for example, copper, which may form a thin oxide layer (not shown) on the surface. In such an embodiment, the size or radius of the connecting member 904 or the complementary face of the contoured stud surface 802 may be configured to take the oxide formation into account during fabrication. Alternatively, the connecting member 904 having the oxide layer may be treated to remove the oxide layer, for example, by way of reduction, cleaning or the like. Additionally, while the connecting members 904 are described as having, in some embodiments, the thin oxide layer, the mounting studs 502 or other metal surfaces may also have or grow a thin oxide layer which may be removed or accounted for during fabrication.

In some embodiments, the second package 902 may be mounted at a height where the bottom surface of the second package 902 is separated from the top surface 602a of the die 602. In one embodiment, the mounting studs 502 and connecting members 904 may be formed at a height sufficient to hold the top package separated from the top surface 602a of the die 602. In another embodiment, the bottom surface of second package 902 may be in direct contact with the top surface 602a of the die 602, or may have an adhesive, heat transfer compound or heat sink disposed between the second package 902 and the top surface 602a of the die 602.

In some embodiments, the contoured stud surface 802 may have a surface topography matching the surface topography of a connecting member 904. Thus, the contoured stud surface 802 and the connecting member 904 may have complementary shapes. In such an embodiment, the contoured stud surface 802 will accept the connecting member with little, or substantially no, deformation of the connecting member 904. Thus, the connecting member 904 may have a first shape prior to being mounted on the mounting stud 502, and a second shape after being mounted to the mounting stud 502, with the first and second being substantially the same. Additionally, there will be few, or substantially no, gaps, bubbles or separation in the contact between the contoured stud surface 802 and the surface of the connecting member 904.

For example, where the connecting member 904 is a solder ball, the contoured stud surface 802 may have a complementary hemispherical, concave shape matching the expected surface contour or topography of the solder ball connecting member 904. Such a contoured stud surface 802 increases the contact area between the solder ball connecting member 904 and the stud 502, while permitting the solder ball connecting member 904 to retain a generally spherical shape without substantial deformation. The solder ball connecting member 904 may be substantially free from distortion that may cause the solder ball to enlarge horizontally and cause a short or bridge to an adjoining solder ball. Therefore, a finer bond pitch, or a smaller separation between adjoining connecting members, may be achieved. In other embodiments, the mounting stud may have a contoured stud surface 802 with a shape corresponding to another connecting member shape, such as an ovoid, cylinder, or the like. For example, where a solder bump is used as a connecting member, the solder bump may have a parabolic shape, and the mounting stud 502 may be milled or etched with a parabolic depression to create the contoured stud surface 802.

Figure 10:
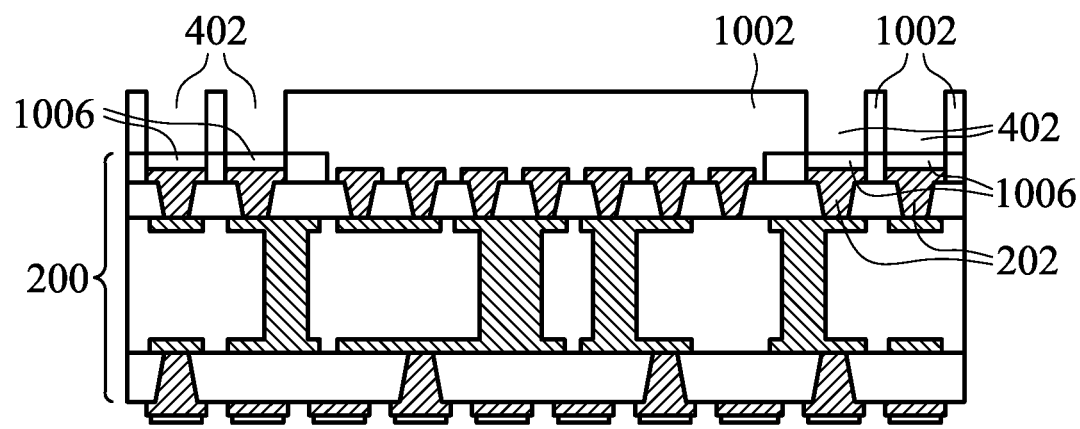
FIGS. 10 through 15 illustrate cross-sectional views of intermediate steps in forming of a package-on-package device with contoured mounting studs according to a second embodiment of the disclosure.

FIGS. 10 through 15 illustrate cross-sectional views of intermediate steps in forming of a package-on-package device with contoured mounting studs according to a second embodiment of the disclosure. In such an embodiment, pre-formed mounting studs 1102 (see FIG. 11) may be attached to the package lands 202. FIG. 10 illustrates the preparation of the package lands 202. While the preparation for the package lands 202 is described here with respect to pre-formed mounting studs 1102, all or part of the described package land preparation steps may be applied to application of the formed mounting studs 502 described above.

Forming the studs 1102 in block 108 may, in some embodiments, further comprise preparation of the package lands 202 for pre-formed mounting studs 1102. For example, a conductive material 1006, such as solder paste, solder or a conductive adhesive may be applied to the package lands 202. Additionally, an organic solderability preservative (OSP), or other solder-compatible coating may be applied to the package lands 202 prior to applying the pre-formed mounting studs 1102. An anticorrosion coating such as an OSP may be applied to the pre-formed mounting studs 1102, to the package lands 202, or to both. An OSP may be advantageous where a first substrate 200 or first package 800 is prepared or assembled prior to mounting a second package 902 (FIG. 9), as the OSP may protect or preserve the surface of a pre-formed mounting stud 1102 or package land 202 that may be prone to corrosion during long term storage or handling.

Alternatively, a coating resistant to corrosion may be applied to the pre-formed mounting studs 1102, the package lands 202, or both. For example, a coating of gold (Au), palladium (Pd), nickel (Ni), alloys of the foregoing, or the like may be deposited or electroplated on the pre-formed mounting studs 1102 or the package lands 202 as an anticorrosion coating.

Additionally, a stencil 1002 or other mask may be provided over the first substrate 200. The stencil 1002 may, for example, be used in place of the mask 302 (FIG. 3), and may be removable or reusable. The stencil 1002 may also have prepositioned stud openings 402 created in the stencil 1002 to align with the package lands 202.

Figure 11:
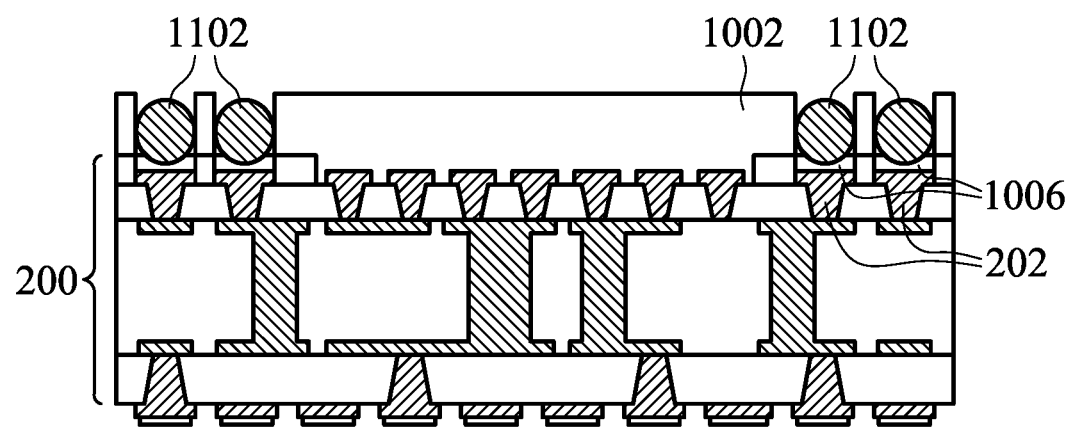

Pre-formed mounting studs 1102 may be applied in block 108 as shown in FIG. 11. In one embodiment, a spherical pre-formed mounting stud 1102 may be placed through the prepositioned stud openings 402. Alternatively, the pre-formed mounting stud 1102 may be cylindrical, or another useful shape. Spherical pre-formed mounting studs 1102 may be applied through the stud openings 402 by applying a suitable volume of spherical mounting studs 1102 over the stencil 1002 and into the stud openings 402.

Figure 12:
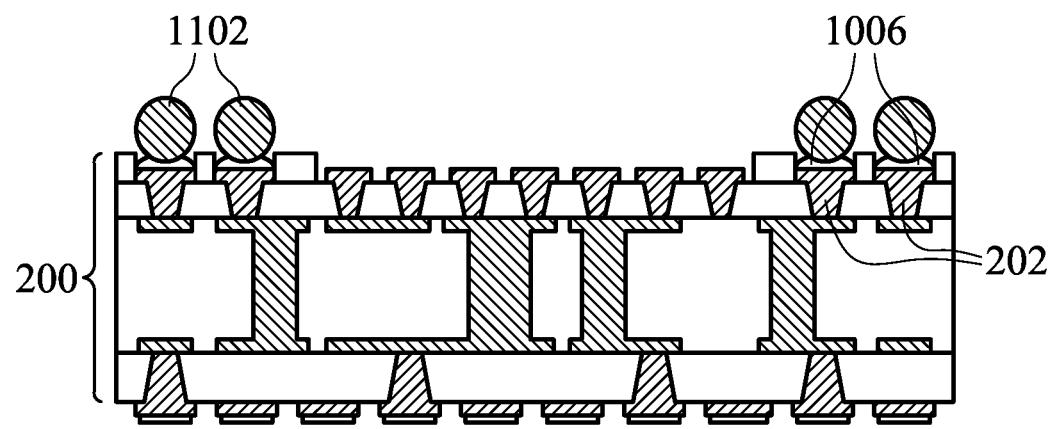

The mounting studs 1102 may then be bonded to the package lands 202 in block 112, as shown in FIG. 12. A pre-formed mounting stud 1102 may be attached to the package land 202 by way of the conductive material 1006. The conductive material 1006 may be solder or solder paste, and the bonding may be performed by reflowing the conductive material 1006.

Figure 13:
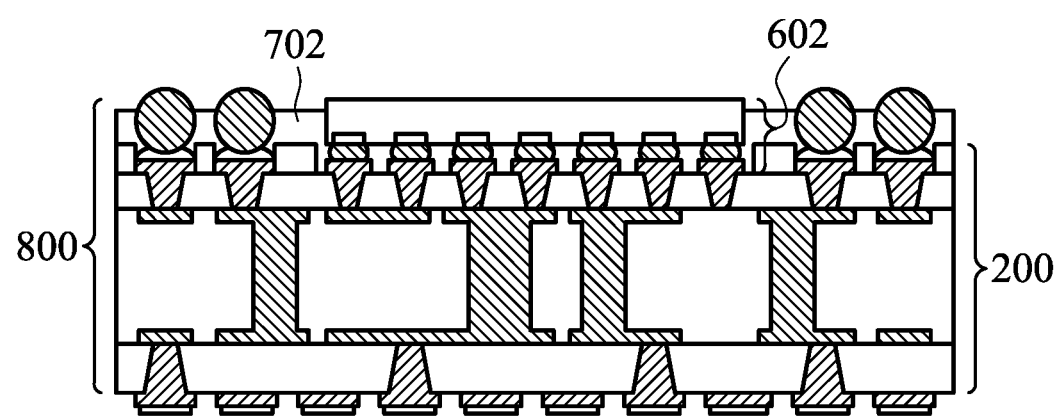
Figure 14:
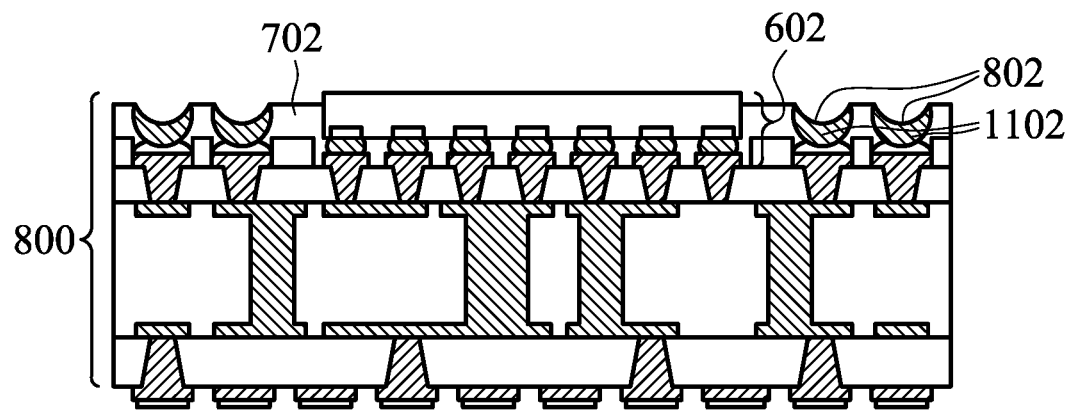
Figure 15:
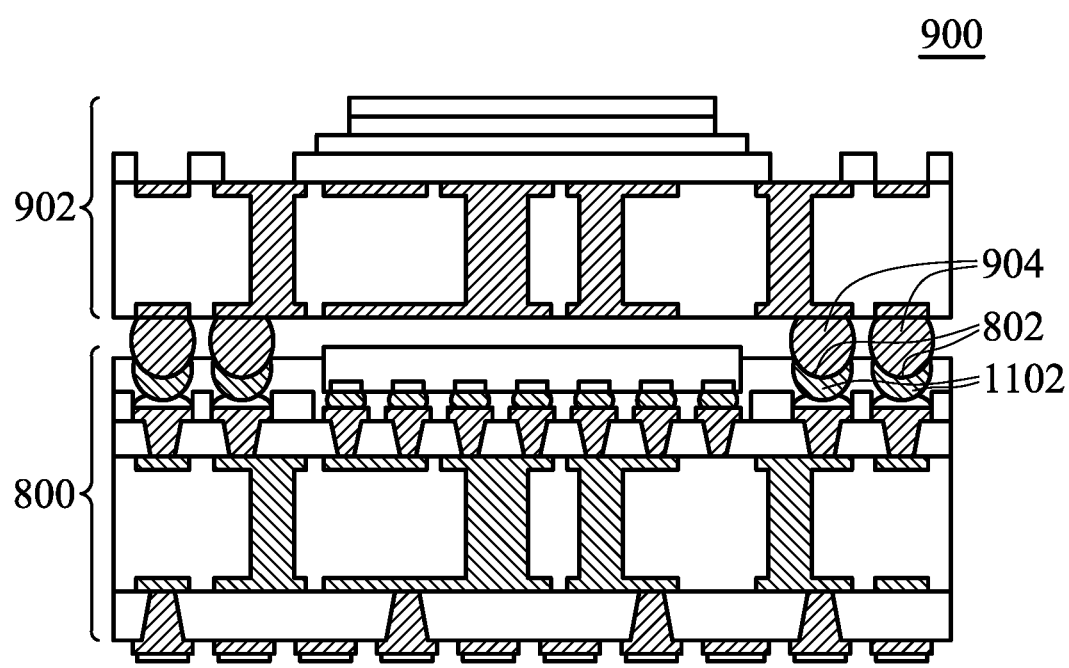

The stencil 1002 may be removed in block 110, and then a die 602 mounted in block 114 and an MUF 702 applied in block 116, as shown in FIG. 13. The pre-formed mounting studs 1102 may be contoured in block 118, as shown in Fig. 14 and a second package 902 mounted to the pre-formed mounting studs 1102 in block 120, as shown in in FIG. 15. The contouring and mounting may be substantially the same techniques described above with respect to FIGS. 8 and 9.

Figure 16A:
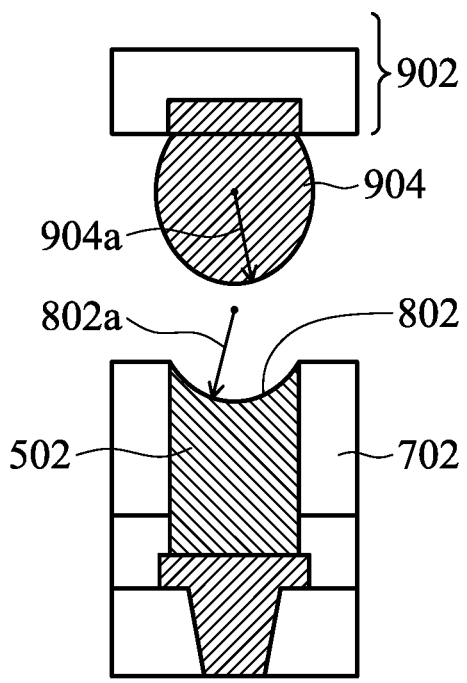
FIGS. 16A-16B illustrate cross-sectional views of contoured mounting studs according to embodiments of the disclosure.
Figure 16B:
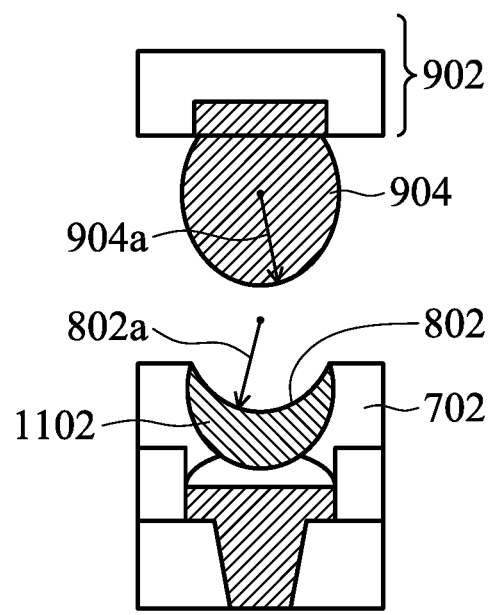

FIG. 16A illustrates a cross-sectional view of a formed or cylindrical mounting stud 502 with a contoured stud surface 802 while FIG. 16B illustrates a cross-sectional view of a spherical pre-formed mounting stud 1102 having a contoured stud surface 802 according to embodiments of the disclosure. In one embodiment, the connecting member 904 may have a radius 904a between about 75 µm and about 165 µm, and a diameter between about 150 µm and about 330 µm. In such embodiments, the radius 802a of the hemispherical contoured stud surface 802 will generally match that of the connecting member 904, namely between about 75 µm and about 165 µm. The mounting stud 502 may, in some embodiments, have a height of about 150 µm, and a radius of about 125 µm, resulting in a diameter of about 250 µm. Similarly, a spherical pre-formed mounting stud 1102 may have a diameter of about 250 µm.

Figure 17:
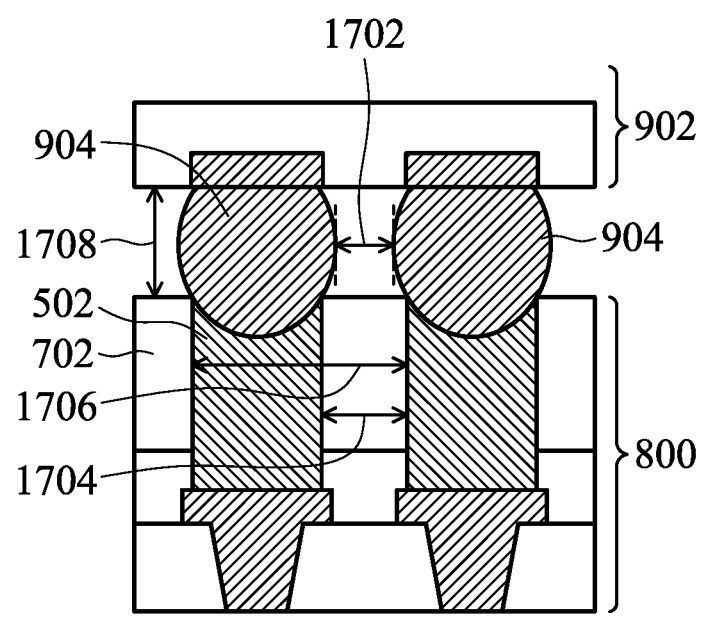
FIG. 17 illustrates a cross-sectional view of embodiments of contoured package-on-package joints according to an embodiment of the disclosure.

FIG. 17 illustrates a cross-sectional view of embodiments of contoured mounting studs in relation to each other according to an embodiment of the disclosure. The bond pitch 1706 may be between about 225 µm and 350 µm, and the standoff height between the first package 800 and the second package 902 may be about 200 µm or less. Skilled practitioners will recognize that the radius 904a of the connecting member 904 and diameter of the mounting stud 502 may be adjusted to achieve a desired bond pitch 1706 and standoff height 1708.

Additionally, embodiments of the mounting studs 502 according the disclosure may have a joint separation 1702 as small as about 15 µm to about 200 µm.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first redistribution layer;
   a substrate over the first redistribution layer;
   a second redistribution layer electrically connected to the first redistribution layer through the substrate;
   a first semiconductor die in physical contact with the second redistribution layer;
   an encapsulant encapsulating the first semiconductor die;
   a conductive via extending through the encapsulant, the conductive via comprising:
     a first straight sidewall facing the first semiconductor die;
     a second straight sidewall opposite the first straight sidewall; and
     a curved surface extending from the first straight sidewall to the second straight sidewall; and
   an external connector is physical contact with the curved surface.

2. The semiconductor device of claim 1, wherein the external connector is a solder ball.

3. The semiconductor device of claim 2, wherein the external connector is part of a second package.

4. The semiconductor device of claim 3, wherein the second package comprises a second semiconductor die located on an opposite side of a package substrate from the external connector.

5. The semiconductor device of claim 1, wherein the first semiconductor die comprises solder bumps in physical contact with the second redistribution layer.

6. The semiconductor device of claim 1, wherein the encapsulant has a surface which is planar with the first semiconductor die.

7. The semiconductor device of claim 1, wherein the second redistribution layer is electrically connected to the first redistribution layer by through substrate vias.

8. A semiconductor device comprising:
   a first package comprising:
     a first substrate;
     one or more first through vias extending through the first substrate;
     one or more via lands;
     at least one semiconductor die electrically connected to the one or more via lands on a first side of the first substrate;
     external connections located on a second side of the first substrate opposite the first side;
   a second package comprising:
     a second substrate;
     one or more second through vias extending through the second substrate;
     a first semiconductor die located on a first side of the second substrate, the first semiconductor die electrically connected to at least one of the one or more second through vias; and
     a copper post located on the first side of the second substrate, the copper post comprising a first straight sidewall which intersects a curved surface that conforms to a shape of one of the external connections.

9. The semiconductor device of claim 8, wherein the at least one semiconductor die comprises at least two semiconductor die.

10. The semiconductor device of claim 9, wherein each one of the at least two semiconductor die is electrically connected to separate ones of the one or more via lands by a wire bond.

11. The semiconductor device of claim 8, wherein the one of the external connections is a solder ball.

12. The semiconductor device of claim 8, wherein the second package further comprises an encapsulant encapsulating the first semiconductor die.

13. The semiconductor device of claim 8, wherein the shape of the one of the external connections is a spherical shape.

14. The semiconductor device of claim 8, wherein the first package is mounted at a standoff height from the second package of 200 µm or less.

15. A semiconductor device comprising:
- a first level comprising a first substrate and a first through via;
- a second level over the first level, the second level comprising a redistribution layer;
- a third level over the second level, the third level comprising an encapsulant, a first semiconductor die, and a through encapsulant via, wherein a sidewall of the through encapsulant via at the third level is perpendicular with the first substrate; and
- a fourth level over the third level, the fourth level comprising a curved surface of the through encapsulant via, the encapsulant, and the first semiconductor die.

16. The semiconductor device of claim 15, wherein the fourth level further comprises a portion of an external connection adjacent to the curved surface.

17. The semiconductor device of claim 16, further comprising a fifth level over the fourth level, the fifth level comprising a package substrate and a second through substrate via.

18. The semiconductor device of claim 17, further comprising a sixth level over the fifth level, the sixth level comprising a second semiconductor die, the second semiconductor die being electrically connected to the second through substrate via.

19. The semiconductor device of claim 18, wherein the second semiconductor die is electrically connected to the second through substrate via through a wire bond.

20. The semiconductor device of claim 18, further comprising a seventh level over the sixth level, the seventh level comprising a third semiconductor die different from the second semiconductor die.

* * * * *